United States Patent [19]

Zerbst

[11] 4,213,940
[45] Jul. 22, 1980

[54] APPARATUS FOR PULLING MONOCRYSTALLINE RIBBON-LIKE BODIES OUT OF A MOLTEN CRYSTALLINE FILM

[75] Inventor: Manfred Zerbst, Munich, Fed. Rep. of Germany

[73] Assignee: Siemens Aktiengesellschaft, Berlin & Munich, Fed. Rep. of Germany

[21] Appl. No.: 817,068

[22] Filed: Jul. 19, 1977

[30] Foreign Application Priority Data

Jul. 20, 1976 [DE] Fed. Rep. of Germany ....... 2632614

[51] Int. Cl.² .............................................. B01J 17/18
[52] U.S. Cl. .................................... 422/246; 156/608; 156/DIG. 88; 156/DIG. 83
[58] Field of Search ......... 156/608, DIG. 83, 617 SP, 156/DIG. 88, DIG. 98, DIG. 64; 23/273 SP; 422/246

[56] References Cited

U.S. PATENT DOCUMENTS

| | | | |
|---|---|---|---|
| 2,893,847 | 7/1959 | Schweickert | 156/608 |
| 3,393,054 | 7/1968 | Rupprecht | 156/608 |
| 3,650,703 | 3/1972 | Labelle, Jr. | 156/608 |
| 3,870,477 | 3/1975 | Labelle, Jr. | 156/608 |

FOREIGN PATENT DOCUMENTS

1471316 12/1968 Fed. Rep. of Germany .
51-30583 3/1976 Japan ...................................... 156/608

OTHER PUBLICATIONS

Bates, Record of the 10th IEEE Photoroltaic Specialists Conference 1973, pp. 197–199, IEEE.
Ciszek et al., Physica Status Solidi, vol. 27, 1975, pp. 231–241.
Labelle, Jr., Mat. Res. Bull., vol. 6, #7, pp. 581–590 (1971).

*Primary Examiner*—Hiram H. Bernstein
*Attorney, Agent, or Firm*—Hill, Van Santen, Steadman, Chiara & Simpson

[57] ABSTRACT

An apparatus for pulling a monocrystalline ribbon-like body from a molten crystalline film via the EFG-process wherein a shaping or profile component having a capillary tube extending therethrough is positioned in contact with a crystalline melt so that a molten crystalline film forms on top of such component and a desired crystalline body is pulled therefrom. Surfaces of the profiling component in contact with the crystalline melt are composed of a material chemically inert with the crystalline melt, such as BeO or sapphire.

1 Claim, 1 Drawing Figure

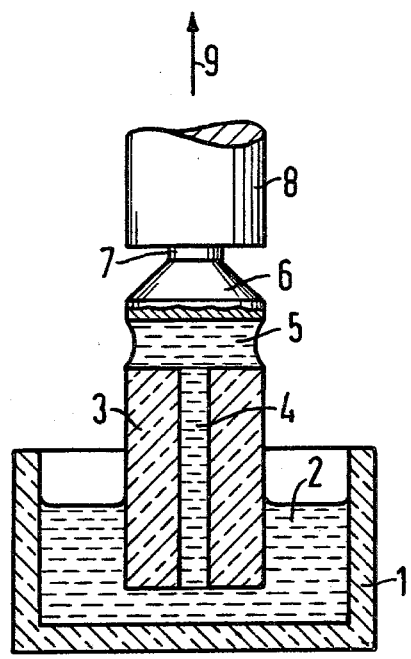

APPARATUS FOR PULLING MONOCRYSTALLINE RIBBON-LIKE BODIES OUT OF A MOLTEN CRYSTALLINE FILM

BACKGROUND OF THE INVENTION

1. Field of the Invention

The invention relates to monocrystalline bodies and somewhat more particularly to an apparatus for pulling monocrystalline ribbon-like bodies from a molten crystalline film.

2. Prior Art

In semiconductor technology, various processes are known for pulling semiconductor crystals or insulating material crystals from an appropriate melt with the aid of a seed crystal. Generally, it is desirable to pull such crystals into the geometric shape which is to be assumed by a semiconductive or insulating component during the production process of such component. For example, a process of this type is suggested in "Physica Status Solidi", Vol. 27, 1975, pages 231–241. The process described in the foregoing article apparently allows the production of silicon ribbons of about 0.5 mm in thickness by using a graphite die having a capillary tube extending therethrough and employing more or less conventional crystal pulling technology based on capillary action. "Material Research Bulletin", Vol. 6, 1971, pages 571–580 describes further embodiments of this type of process wherein sapphire filaments are pulled from a molten sapphire film positioned on an end surface of a capillary die component through which a capillary tube extends, with a lower end of the tube being in contact with the melt reservoir and the upper end of the tube being open for contact with a seed crystal. The shape of the upper end surface of the capillary die or profiling component determines the shape of the pulled crystal. By appropriately selecting profile components having a desired end surface, one can pull crystals of such desired shape, for example, tubular, filament or ribbon.

In accordance with the prior art suggestions, capillary dies useful for pulling sapphire crystals are composed of molybdenum, tungsten or iridium while capillary dies useful for pulling silicon crystals are composed of graphite.

However, the practice of the above-described process, which is sometimes referred to as the "EFG-process" ("edge-defined, film-fed growth process"), to produce monocrystalline bodies, such as of silicon, yields a very large number of crystal disturbances or imperfections and crystal doping so that it is currently preferable to utilize other processes for producing monocrystals, such as composed of silicon.

SUMMARY OF THE INVENTION

The invention provides an improved EFG-process and apparatus whereby the above prior art disadvantages are materially reduced so that less crystal disturbances and imperfections occur in pulled ribbon-like monocrystalline bodies.

In accordance with the principles of the invention, the capillary die, comprised of a profiling component having a capillary tube extending therethrough, is composed, at least on surfaces thereof in contact with a crystal melt, of a relatively inert material which does not chemically react with the material of the melt at the temperature required for pulling a monocrystalline body from such melt. In preferred embodiments of the invention, the inert material is a metal oxide having a relatively high melting point, such as BeO or sapphire and may be in a monocrystalline state.

BRIEF DESCRIPTION OF THE DRAWING

The FIGURE is an elevated, partial, somewhat schematic and cross-sectional view of an apparatus embodiment constructed and operating in accordance with the principles of the invention.

DESCRIPTION OF THE PREFERRED EMBODIMENTS

The invention provides an apparatus useful in the EFG-process ("edge-defined, film-fed growth process"), whereby pulled crystals with reduced crystal disturbances and lower impurity content are attained.

The apparatus of the invention comprises a profiling component having a capillary tube extending therethrough and is adapted to contact a crystal melt within a melt reservoir so that a molten film forms on the upper end surface of the profile component and a seed crystal is brought into contact with such film for pulling a monocrystalline ribbon-like body therefrom. A lower end of the capillary tube is positioned beneath the upper surface of a crystal melt and the upper end of such tube terminates at the upper end surface of the profiling component. In accordance with the principles of the invention, at least surfaces of the profiling component forming walls of the capillary tube and surfaces in contact with a molten crystalline material are composed of a relatively inert material which does not chemically react with the material of the melt at the temperature required for pulling a monocrystalline body out of the melt.

In preferred embodiments of the invention, the inert material used to form at least select surfaces of the profiling component above described is a relatively high melting metal oxide. Such metal oxide is preferably selected from the group consisting of BeO and sapphire ($Al_2O_3$). Further, it is preferable that the select metal oxide be in monocrystalline form.

In the development of the invention, it was recognized that a fundamental cause of difficulties with the EFG-process, above described, during the profile-pulling of silicon ribbon, was the relatively high reactivity of molten silicon with the material forming the capillary die or the profiling component. In particular, when graphite was utilized to form a capillary die, it was noted that molten silicon reacted quite quickly with this material so that impurities or foreign materials were incorporated within the pulled crystal and crystal defects were produced, more or less simultaneously. Accordingly, in following the principles of the invention, the material utilized to form a capillary die or a profiling component is selected so as to be relatively inert to a desired crystal melt and which does not chemically react with the molten crystal material at the temperatures employed during crystal pulling. When such an inert material is utilized, in accordance with the principles of the invention, for a capillary die or a profiling component, no reaction products can arise or accumulate in a molten crystalline film and thus cannot become incorporated into the pulled crystal during the pulling process. This prevents both surface disturbances and interior disturbances within the pulled crystal. Preferably, the profiling component material is a monocrystalline material since monocrystals have proven to be more resistant to interaction with crystalline melts.

In accordance with the principles of the invention, at least those surfaces of the profiling component which define the capillary tube and/or are in contact with a crystal melt are composed of relatively high melting metal oxide. Sapphire and/or BeO are particularly suitable materials for use in pulling silicon monocrystalline ribbon-like bodies.

Referring now to the illustration, a crucible 1 is provided with a molten crystal material melt 2. The crucible 1 is composed of a material which is relatively inert or will not be chemically attacked by the material within melt 2. A profiling component 3 having a capillary tube 4 extending therethrough is positioned above the crucible 1 so that at least a lower part of component 3 is submerged within the melt 2. A molten film 5 forms, by capillary action, on the upper end of component 3. A seed crystal 7 is attached to an axially movable support 8, which is operationally coupled to a suitable drive means, schematically illustrated at arrow 9. At the start of the process, the seed crystal 7 is lowered into contact with the upper edge of molten film 5 and is then controllably pulled upward so that a ribbon-like body 6 attaches to the seed crystal 7 and is pulled upwardly with the seed crystal. The molten film 5 has inwardly bent side surfaces, as shown, as a result of surface tension of the molten crystalline material. As the support 8, seed crystal 7 and body 6 are slowly pulled upward, more molten crystalline material flows through the capillary tube 4 from crucible 1 and grows, at the upper end of molten film 5, onto crystal body 6. As will be appreciated, during this growth process, the body 6 functions as a seed for the material being deposited.

The profiling component 3 and capillary tube 4 have all surfaces thereof which are in contact with the molten crystalline material, i.e., the melt 2 or the molten film 5, composed of a material which does not react with the molten crystalline material at the temperatures encountered during the crystal pulling process. In instances where the molten crystalline material is silicon, the select surfaces of the profiling component and capillary tube are composed of sapphire or BeO. The crucible 1 may also be composed of sapphire or BeO.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

I claim as my invention:

1. In an apparatus for pulling a silicon monocrystalline ribbon-like body from a molten silicon film positioned on an end surface of a profiling component having a capillary tube extending therethrough, one end of such tube opening into a melt reservoir having molten silicon therein and the other end of such tube terminating at the profiling component end surface, the improvement comprising wherein:

at least surfaces of the profiling component forming walls of the capillary tube and surfaces in contact with the molten silicon are composed of a monocrystalline sapphire.

* * * * *